US006798264B2

(12) United States Patent
Swanson et al.

(10) Patent No.: US 6,798,264 B2
(45) Date of Patent: Sep. 28, 2004

(54) METHODS AND APPARATUS FOR SIGNAL PROCESSING

(75) Inventors: Travis E. Swanson, Ramsey, MN (US); Steven R. Van Kirk, Brooklyn Park, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/216,698

(22) Filed: Aug. 8, 2002

(65) Prior Publication Data

US 2004/0027170 A1 Feb. 12, 2004

(51) Int. Cl.$^7$ .............................................. H03K 3/037
(52) U.S. Cl. ....................................... 327/205; 327/74
(58) Field of Search .......................... 327/205, 74, 206, 327/75, 68, 87

(56) References Cited

U.S. PATENT DOCUMENTS

| 4,650,333 A | * | 3/1987 | Crabb et al. ................. 356/376 |
| 5,614,857 A | * | 3/1997 | Lim et al. .................... 327/205 |
| 6,151,648 A | | 11/2000 | Haq ............................ 710/107 |
| 6,160,423 A | | 12/2000 | Haq ............................ 327/41 |
| 6,255,859 B1 | | 7/2001 | Haq ............................ 327/14 |
| 6,327,205 B1 | | 12/2001 | Haq ............................ 364/214 |
| 6,430,606 B1 | | 8/2002 | Haq ............................ 709/208 |

FOREIGN PATENT DOCUMENTS

| JP | 01019812 A | * | 7/1987 |
| WO | WO 99/48260 A1 | | 9/1999 |

OTHER PUBLICATIONS

JAZio Test Chip Results; Test chip database for 0.18u and documentation. 11 pgs.
"JAZio Enhancements to Achieve Very High Data Rates Per Pin for Parallel Interfaces"; JAZio High Speed Digital I/O Signal Switching Technology; Jul. 18, 2001; 14 pgs.
JAZio High Speed Digital I/O Signal Switching Technology; Jul. 20, 2000; 16 pgs.
"Improving Performance of Parallel Interfaces using Stead State Voltage and Timing References"; Aug. 1, 2002; 14 pgs.
JAZio—New Supplemental Material; "Change No–Change Concept"; 25 pgs.
JAZio—Presentation File.
JAZio—Presentation —Last Updated: Sep. 25, 1999.
JAZio—Presentation—Last Updated: Nov. 2, 1999.

* cited by examiner

Primary Examiner—Dinh T. Le
(74) Attorney, Agent, or Firm—Snell & Wilmer L.L.P.

(57) ABSTRACT

A method and apparatus for signal processing may include an electronic circuit comprising a receiver configured to receive a signal and a dynamic threshold circuit configured to process the signal. The dynamic threshold circuit is configured to compare the signal to a threshold and generate an output signal according to the comparison. The dynamic threshold circuit is also configured to change the threshold to a selected level at a selected time. In various embodiments, the selected level is selected to be a level between the level of the input signal and a midpoint of the input signal. In another embodiment, the selected time is selected to correspond to a stabilization time of the input signal.

13 Claims, 7 Drawing Sheets

METHODS AND APPARATUS FOR SIGNAL PROCESSING

FIELD OF INVENTION

The present invention generally relates to electronic circuits.

BACKGROUND OF THE INVENTION

Many electronic devices use binary signals to communicate among components. For example, many electronic systems use logical ones and zeros to signify data and operations. The logical ones and zeros are communicated in the form of electrical signals having one of two values. Consequently, such systems rely on stable signals having one of the two values.

Unstable signals tend to disrupt communications by varying the signal. Any signal exhibiting a value other than the accepted binary values may be interpreted incorrectly by the receiving component. Several causes may contribute to unstable signals, such as reflections due to impedance mismatches among connections. In some cases, instability may be present in the form of ringback, manifested by a sharp deviation away from the intended signal value as a relatively large reflection interferes with the original signal until the signal stabilizes.

To compensate for unstable signals, binary circuits typically use high-gain amplifiers having rail voltages at the two desired binary values to receive input signals. For example, a conventional input circuit may comprise a differential amplifier having a first input connected to the input signal and a second input connected to a reference voltage, such as a voltage level midway between the rail voltages. If the input signal is even slightly higher than the reference voltage, the amplifier tends to amplify the difference and generate an output signal at the high rail voltage. Likewise, if the input signal is below the reference voltage, the amplifier generates an output signal at the low rail voltage.

Conventional differential amplifier circuits may still be subject to unstable signals.

For example, if the magnitude of a ringback voltage is high enough, the unstable signal may again cross the reference voltage, generating an unwanted pulse from the differential amplifier. In addition, some circuit topologies tend to cause the input signal to fluctuate as it approaches the midpoint between the rail voltages. Consequently, instead of the output signal switching from one extreme to another, the differential output signal may include multiple unwanted pulses as the input signal fluctuates near the midpoint.

To reduce the susceptibility to noise, some circuits use hysteresis to provide multiple reference voltages. For example, a circuit may use a Schmitt trigger to receive the input signal, which switches the output negative when the input signal crosses a high threshold. The Schmitt trigger then uses negative feedback to prevent switching back to the lower state until the input signal crosses a low threshold voltage.

Such hysteresis configurations, however, tend to exhibit inaccurate thresholds.

Further, a hysteresis configuration may slow the responsiveness of the system. At each edge, reaching the threshold voltage requires a greater change in the input signal voltage, which requires greater time to reach the threshold. Consequently, though hysteresis systems may exhibit improved noise resistance, such systems are also less responsive and may be inaccurate.

SUMMARY OF THE INVENTION

A method and apparatus for signal processing according to various aspects of the present invention includes an electronic circuit comprising a receiver configured to receive a signal and a dynamic threshold circuit configured to process the signal. The dynamic threshold circuit is configured to compare the signal to a threshold and generate an output signal according to the comparison. The dynamic threshold circuit is also configured to change the threshold to a selected level at a selected time. In various embodiments, the selected level is selected to be a level between the level of the input signal and a midpoint of the input signal. In another embodiment, the selected time is selected to correspond to a stabilization time of the input signal.

BRIEF DESCRIPTION OF EXEMPLARY DRAWINGS

Additional aspects of the present invention are evident upon reviewing the nonlimiting embodiments described in the specification and the claims, in conjunction with the accompanying figures, wherein like numerals designate like elements:

Elements in the figures are illustrated for simplicity and clarity and have not necessarily been drawn to scale. For example, the dimensions of some of the elements in the figures may be exaggerated relative to other elements to improve understanding of embodiments of the present invention.

DETAILED DESCRIPTION OF EXEMPLARY EMBODIMENTS

Various aspects and features of the present invention may be described in terms of functional components and steps. Such functional components and steps may be realized by any number of elements and/or steps configured to perform the specified functions. For example, the present methods and apparatus may employ electronic, signaling, and logic elements, like amplifiers, switches, delay lines, and logic gates, which may carry out a variety of functions in various embodiments, applications, and environments. In addition, the present methods and apparatus may be practiced in conjunction with any number of procedures and systems, and the apparatus and methods described are merely exemplary applications for the invention. Further, the present methods and apparatus may employ any number of techniques, conventional or otherwise, for placement, use, manufacturing, and the like.

Figure 1:
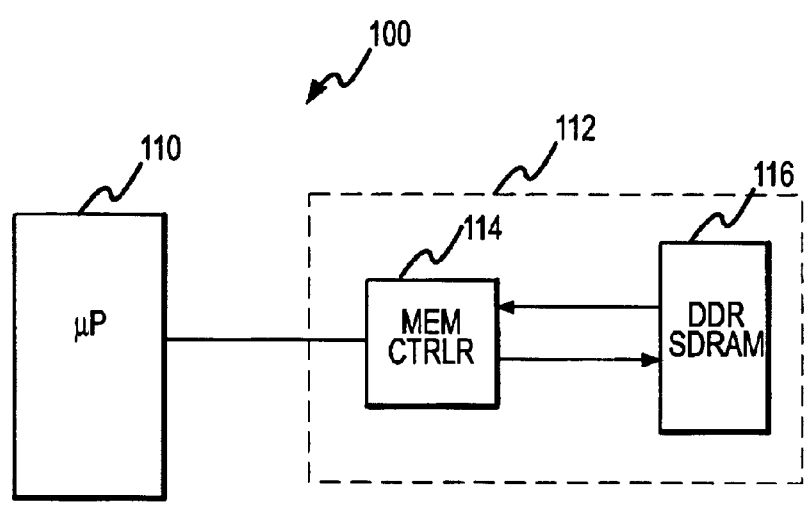
FIG. 1 is a block diagram of an electronic system according to various aspects of the present invention.

An electronic system according to various aspects of the present invention includes a plurality of components operating in conjunction with a threshold circuit. The components may comprise any components using a threshold circuit, such as multiple integrated circuits and electrical components on a single board, various elements in a single integrated circuit, various components of a computer system, or any other components. For example, referring to FIG. 1, an exemplary electronic system 100 suitably comprises a processor 110 and a memory system 112. The processor 110 controls the electronic system 100 in accordance with a program. The processor 110 may comprise, for example, a conventional central processing unit, such as an Intel Pentium processor or an Advanced Micro Devices Athlon processor.

The memory system 112 stores information for subsequent retrieval. The memory system 112 may comprise any appropriate memory, memory system, or storage device or system. For example, the memory system 112 may comprise a main memory subsystem including a memory controller, one or more memory chips, and associated logic and circuitry. In the present embodiment, the memory system 112 comprises a memory controller 114 and one or more memories 116. The memory controller 114 suitably comprises any appropriate system for controlling access to and/or operation of the memory 116 and interfacing the memory 116 with other parts of the electronic system 100. The memory 116 comprises a system for storing information. The memory 116 may comprise any appropriate storage system, such as a ROMs, PROMs, DRAMs, tapes, disks, or other suitable storage medium. In the present embodiment, the memory 116 includes an SDRAM, such as a DDR SDRAM available from Micron Technology, Inc.

Figure 2:
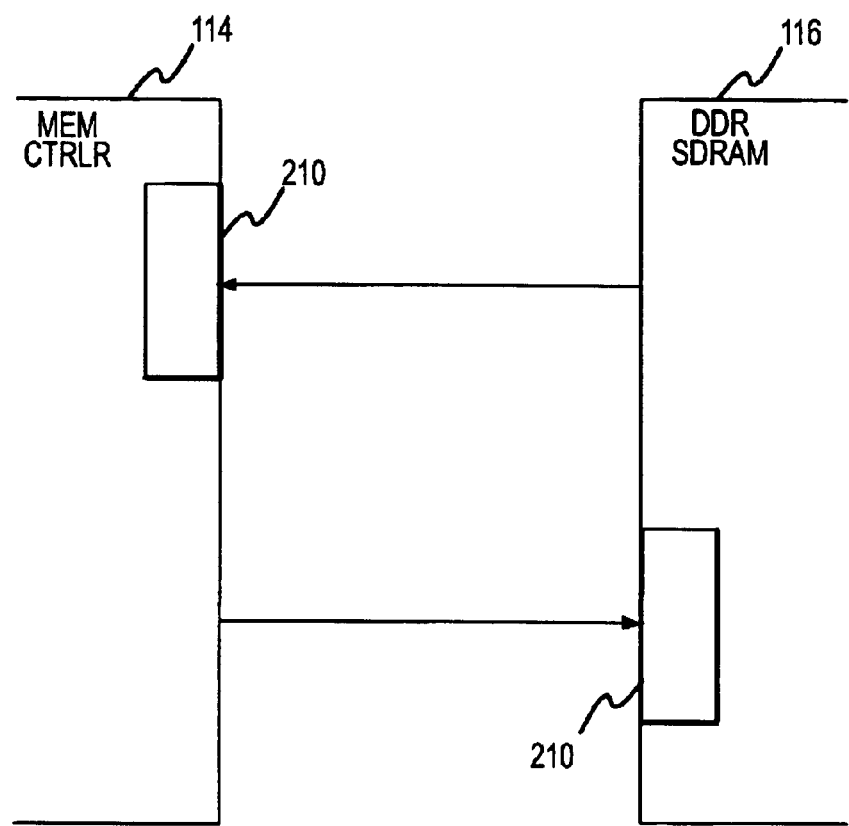
FIG. 2 is a block diagram of a memory system having a dynamic threshold circuit.

The memory 116 includes a dynamic threshold circuit. The dynamic threshold circuit may operate in conjunction with one or more receiver components in the electronic system 100 configured to receive signals, such as, but not limited to, the memory 116. For example, referring to FIG. 2, a dynamic threshold circuit 210 according to various aspects of the present invention is integrated into the memory 116 and the memoir controller 114. Dynamic threshold circuit 210 may be included, however, in any suitable receiver components of the electronic system 100, such as the processor 110 or other element. Further, the dynamic threshold circuit 210 may be implemented in any appropriate manner, for example as a separate circuit or integrated into the receiver. Further, the dynamic threshold circuit 210 may be implemented differently according to the particular operating environment. For example, the dynamic threshold circuit 210 may be implemented differently for the memory controller 114 and the memory 116, such as using different threshold levels or frequencies.

The dynamic threshold circuit 210 according to various aspects of the present invention tends to provide relatively stable output signals based on relatively unstable input signals. In particular, the dynamic threshold circuit 210 may be configured to generate an output signal by comparing an input signal to a dynamic threshold. The dynamic threshold circuit 210 may also be configured to change the threshold according to any suitable criteria, such as the value of the output signal and the passage of time.

Figure 3:
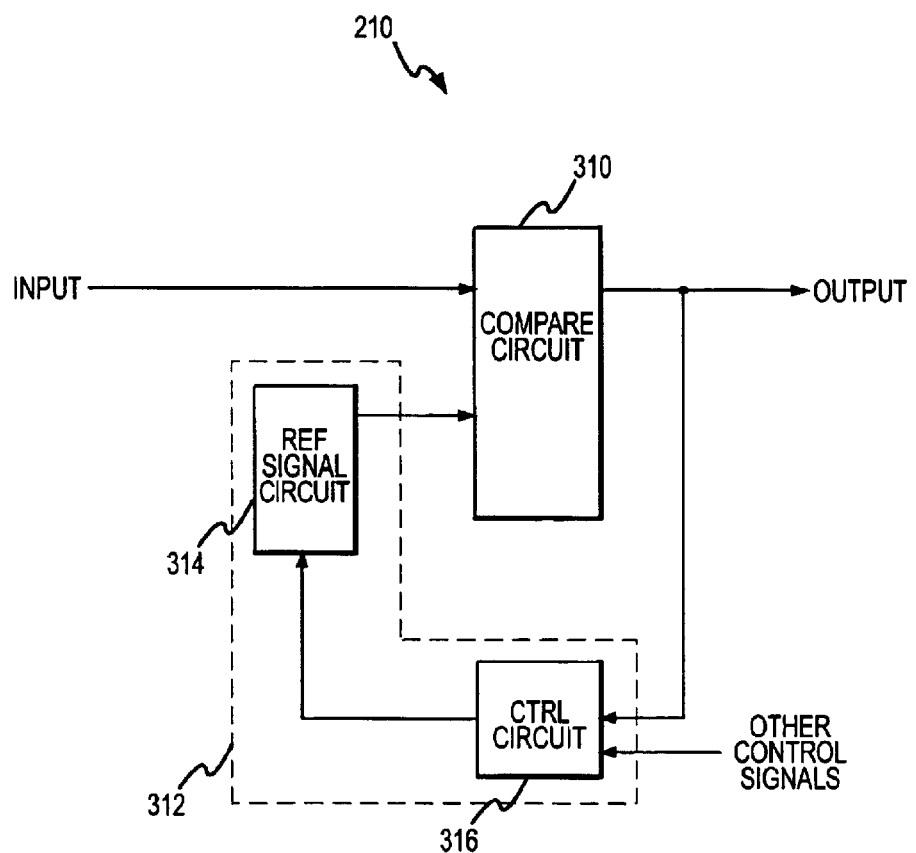
FIG. 3 is a block diagram of an exemplary dynamic threshold circuit.

For example, referring to FIG. 3, a dynamic threshold circuit 210 according to various aspects of the present invention comprises a compare circuit 310 and a threshold supply 312. The compare circuit 310 is suitably configured to compare an input signal to one or more thresholds and generate one or more output signals according to the comparison. The threshold supply 312 is suitably configured to control the threshold used by the compare circuit 310.

Figure 4:
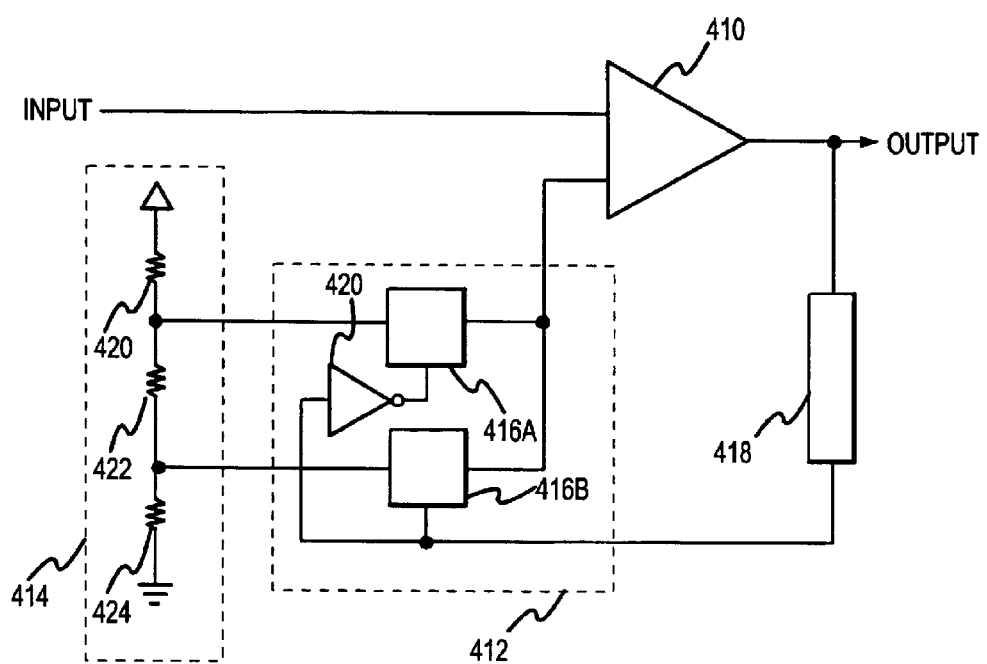
FIG. 4 is a schematic diagram of an exemplary dynamic threshold circuit.

The compare circuit 310 compares the input signal to a threshold signal received from the threshold supply 312. The compare circuit 310 also generates an output signal according to the comparison. The compare circuit 310 may comprise any suitable circuit for comparing signals. For example, referring to FIG. 4, the compare circuit 310 may comprise a differential amplifier 410 having a first input connected to the input signal voltage and a second input connected to the threshold supply 312. The differential amplifier 410 generates the comparison signal, such as a differential signal proportional to the difference between the input signal voltage and the threshold signal voltage. The differential amplifier 410 may be configured for high gain such that any significant difference between the input signal and the threshold signal causes the output signal to reach the maximum or minimum rail voltage of the differential amplifier 410.

Referring again to FIG. 3, the threshold supply 312 provides threshold signals to the compare circuit 310. The threshold supply may be configured in any manner to selectively provide different threshold signals to the compare circuit 310 according to any suitable criteria or scheme. The threshold supply 312 according to the present embodiment is configured to provide a first threshold signal until the output of the compare circuit 310 changes. When the compare circuit 310 output signal changes, the threshold supply 312 changes the threshold to a selected value at a selected time. The threshold supply 312 may be configured in any suitable manner to provide any number of threshold signals, such as three or more signals for a multi-level signaling environment. The threshold supply 312 may also be configured to provide different threshold signals at different times, such as following one or more delays after a change in another signal.

Figure 5:
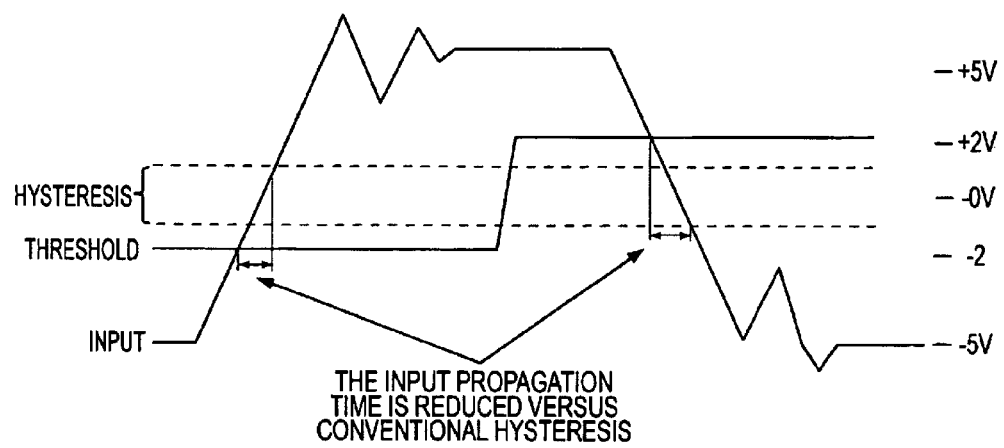
FIG. 5 is a signal diagram illustrating a reduced signal propagation time using a dynamic threshold compared to a hysteresis-based threshold.

For example, a rising or falling edge of the input signal may cross the threshold provided by the threshold supply 312. In response, the output of the compare circuit 310 switches to a new value. The threshold supply 312 then changes the threshold value according to any appropriate criteria. In the present embodiment, the threshold supply 312 changes the threshold value to a value between the new level of the input signal and the midpoint between the intended high and low stable values of the input signal. For example, referring to FIG. 5, the input signal is initially at a logic LOW level, such as −5 volts. The threshold supply 312 is suitably configured to select the level of the threshold signal to enhance input signal propagation. The threshold signal provided to the compare circuit 310 suitably lies closer to the input signal voltage than the midpoint (0 volts) does. For example, the threshold supply 312 may provide a threshold of −2 volts to the compare circuit 310. Consequently, when the rising edge of the input signal is received, the threshold crossing occurs earlier than if the threshold were set to the midpoint of 0 volts or, in a system using hysteresis, higher than 0 volts.

Figure 6:
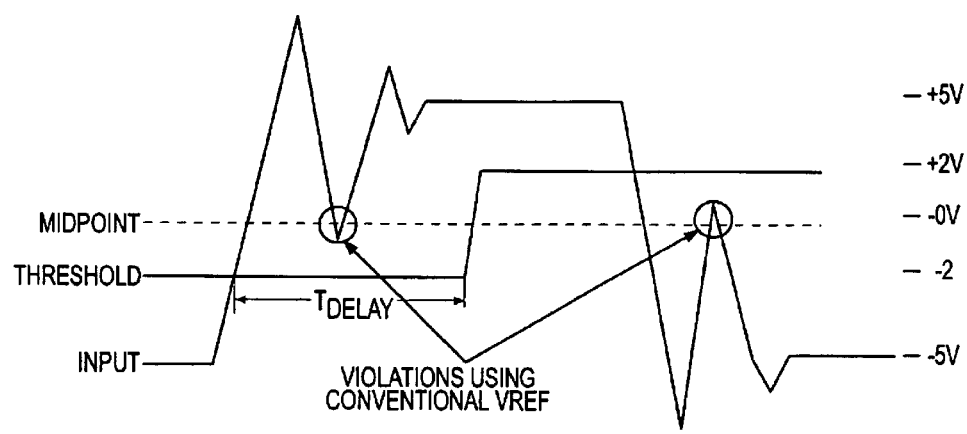
FIG. 6 is a signal diagram illustrating a lower susceptibility to ringback using a dynamic threshold compared to a midpoint threshold.

Further, the threshold supply 312 is suitably configured to change the value of the threshold at a selected time, such as following a selected delay after the input signal crosses the threshold, to enhance the stability of the output signal. For example, referring to FIG. 6, the input signal is initially at a logic LOW level, such as −5 volts, and the threshold provided to the compare circuit 310 is suitably closer to the input signal voltage than the midpoint voltage is. When the rising edge of the input signal is received, the input signal crosses the threshold and the output of the compare circuit 310 changes. The threshold supply 312, however, may delay changing the threshold. The threshold supply 312 may delay a selected time $T_{DELAY}$ before changing the threshold, for example to allow the input signal to settle. Because of the delay in changing the threshold, instability in the signal, for example due to ringback or other causes, is less likely to cause an inadvertent output change from the compare circuit 310. The difference between the input signal level and the threshold is suitably greater than the difference between the input signal level and the midpoint (0 volts) between the maximum and minimum input signal values (+5 volts and −5 volts, respectively). Consequently, the threshold supply 312 may insert a delay of any suitable duration to allow the input signal to stabilize.

The level of noise in the input signal may also affect the threshold level selected. For example, if the input signal is initially subject to large changes but eventually settles to a stable level, the magnitude of the threshold may be larger to inhibit inadvertent threshold crossings. If the input signal includes significant noise even after the inserted delay, however, the selected threshold magnitude may be lower to reduce the likelihood of threshold crossings caused by noise.

The threshold supply 312 may be configured in any manner to selectively generate multiple threshold signals at selected times. For example, a threshold supply 312 according to various aspects of the present invention comprises a reference signal circuit 314 and a control circuit 316. The reference signal circuit 314 generates multiple threshold signals for the compare circuit 310. The control circuit 316 controls threshold signals provided to the compare circuit 310.

More particularly, the reference signal circuit 314 suitably generates multiple thresholds, such as a high and a low threshold voltage, for the compare circuit 310. In the present embodiment, the thresholds may comprise any suitable voltage or other signal to be used by the compare circuit 310. The reference signal circuit 314 is suitably configured to provide a threshold signal to the compare circuit 310 that is closer to the current input signal than the midpoint between the maximum and minimum input signals.

For example, the maximum input signal may be +5 volts and the minimum input signal may be −5 volts. The midpoint between the maximum and minimum input signals is 0 volts. Thus, the reference signal circuit 314 may be configured to provide two intermediate threshold voltage levels, such as +2 volts and −2 volts. The difference between the extremes of the input signal and the threshold signal may be selected according to any appropriate criteria. For example, the threshold voltages may be selected to have sufficient magnitude to inhibit output toggling due to noise around the rising and falling edges of the input signal and/or to enhance response time.

The reference signal circuit 314 may be configured in any suitable manner to generate the threshold voltages. For example, referring again to FIG. 4, the reference signal circuit 314 includes a selection circuit 412 connected to a multiple voltage source 414 to provide one of the voltages to the compare circuit 310 as the threshold signal. The multiple voltage source 414 suitably comprises a voltage divider circuit having one or more taps to generate multiple voltage levels. The voltage divider suitably includes one or more impedances 420, 422, 424 to form the voltage divider. In the present embodiment, the impedances 420, 422, 424 comprise conventional resistors. Alternatively, the impedances 420, 422, 424 may comprise variable resistors, resistive-capacitive elements, transistors, or any other appropriate elements for generating the desired threshold signals. Further, the voltages from the voltage divider may be any appropriate voltages or other signals from which the threshold signals may be derived. The multiple voltage source 414, however, may comprise any suitable system, including on-chip, off-chip, or combination systems, for generating multiple signals having different levels. For example, in a multi-level signaling environment, the multiple voltage source 414 may be configured to provide three or more different threshold signals.

The selection circuit 412 controls the voltage provided to the compare circuit 310 from the multiple voltage source 414. The selection circuit 412 may comprise any appropriate system for selectively transferring a signal from the multiple voltage source 414 to the compare circuit 310, such as a switch or a multiplexer. In the present embodiment, the selection circuit 412 comprises multiple pass gates 416A, B. Each pass gate 416A, B receives one of the voltage levels from the multiple voltage source 414 and has an output connected to the threshold input of the differential amplifier 410. The control circuit 316 controls each pass gate. By selectively activating the pass gates 416A, B, the control circuit 316 may control the threshold signal provided to the differential amplifier 410.

Referring again to FIG. 3, the control circuit 316 controls the reference signal circuit 314 to change the value of the threshold. For example, the control circuit 316 may be configured to control the threshold signal provided to the compare circuit 310 and the time at which the threshold signal is changed. The control circuit 316 is suitably configured in any appropriate manner to control the threshold according to any suitable inputs or criteria. For example, the control circuit 316 may be configured to provide a higher threshold voltage when the output signal of the compare circuit 310 is logic HIGH and, conversely, provide a lower threshold voltage when the output signal is logic LOW. The control circuit 316 may also be configured to change the threshold signal following a selected delay after a change in the output signal. The duration of the delay may be initiated at any time, such as in response to the input signal, the output signal, or any other signal, and may be selected according to any criteria. For example, the duration of the delay may be selected to allow adequate settling time in the input signal before changing the threshold value. In addition, the control circuit 316 may be configured to operate in conjunction with any appropriate input signals, such as control signals from a clock or a timer circuit, to select the timing and level of the threshold signals.

In the present embodiment, the control circuit 316 controls the threshold voltage provided to the differential amplifier 410 in response to the output of the differential amplifier 410. Referring again to FIG. 4, the control circuit 316 suitably comprises a delay circuit 418 having an input connected to the output of the differential amplifier 410. The delay circuit 418 output is directly connected to the second pass gate 416B and via an inverter 420 to the first pass gate 416A. The delay circuit 418 may comprise any suitable element configured to insert a delay into a signal, such as an array of resistors, metal lines, a set of series-coupled NAND gates and inverters, or more complex logic gate delay circuits.

In the present embodiment, the differential amplifier 410 receives the input signal and one of the multiple threshold signals from the multiple voltage source 414. The selection circuit 412 selects which of the possible threshold signals is provided according to the differential amplifier 410 output. If the current output of the differential amplifier 410 is high, the differential amplifier 410 receives the high threshold signal from the multiple voltage source 414. Conversely, if the current output of the differential amplifier 410 is low, the differential amplifier 410 receives the low threshold signal from the multiple voltage source 414.

The threshold signals used at different times, such as following selected delays or in response to any suitable control signals, may be selected according to any suitable criteria.

For example, in an alternative embodiment, the threshold signals provided to the differential amplifier 410 may be reversed. Accordingly, if the current output of the differential amplifier 410 is low, the differential amplifier 410 receives the high threshold signal from the multiple voltage source 414, and vice versa.

Figure 7:
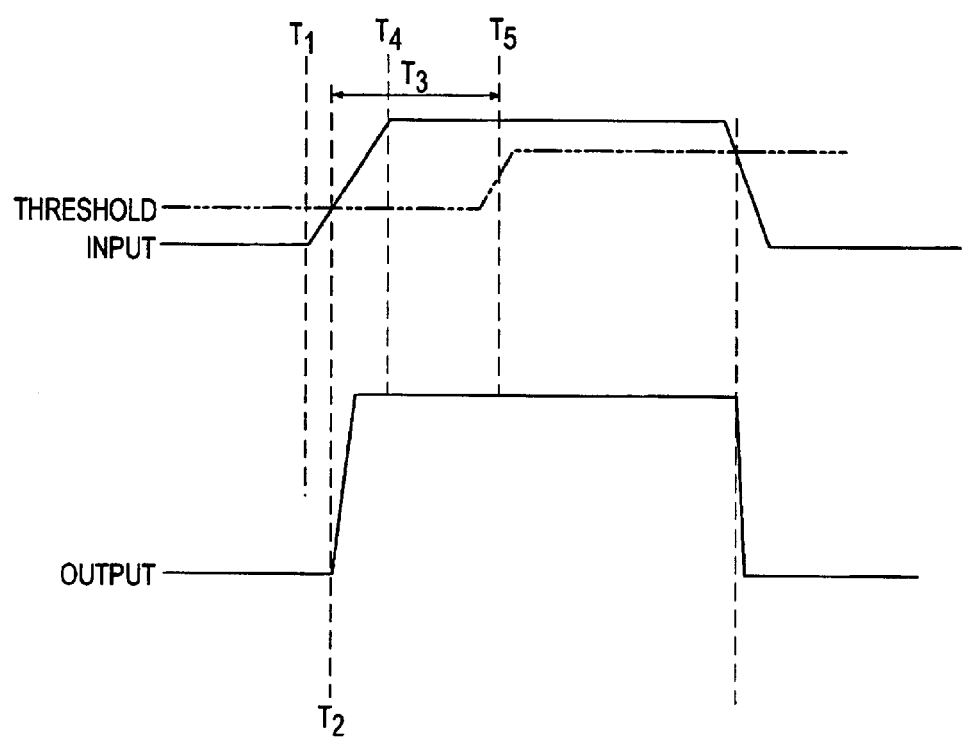
FIG. 7 is a timing diagram illustrating an input signal, a dynamic threshold, and an output signal.

Referring to FIG. 7, in the present embodiment, the input signal is initially logic LOW. Because the input signal is below the threshold voltage, the differential amplifier 410 generates a logic LOW output signal corresponding to the low rail voltage of the differential amplifier 410. The logic LOW signal is provided to the selection circuit 412, which activates the low threshold pass gate 416B to provide the low threshold signal to the differential amplifier 410.

The input signal begins its rising edge at time $T_1$. When the input signal exceeds the low threshold signal level at time $T_2$, the output of the differential amplifier 410 switches to a logic HIGH output signal corresponding to the high rail voltage of the differential amplifier 410. The logic HIGH output signal of the differential amplifier 410 is provided to the control circuit 316, which selectively changes the threshold. In the present embodiment, the delay circuit 418 inserts a delay into the signal provided to the pass gates 416A, B.

Consequently, the threshold remains at the low threshold value for a selected delay $T_3$. The threshold may remain at the lower threshold value after the input signal reaches its maximum value at time $T_4$. At time $T_5$ at the end of the selected delay $T_3$, the control circuit 316 changes the threshold to the high threshold value.

The present invention is described with reference to various preferred embodiments. However, changes and modifications may be made to various exemplary embodiments without departing from the scope of the present invention. These and other changes or modifications are intended to be included within the scope of the present invention as set forth in the appended claims.

What is claimed is:

1. An electronic circuit comprising:
a receiver configured to receive a first signal; and
a dynamic threshold circuit configured to provide the first signal to the receiver, wherein the dynamic threshold circuit comprises a compare circuit configured to compare an input signal to a threshold and generate the first signal according to the comparison; and
a threshold supply configured to change the threshold to a selected level at a selected time, wherein the threshold supply comprises: a control circuit coupled to the comparison circuit and configured to generate a control signal at the selected time in response to a change in the first signal, wherein the control circuit comprises a delay circuit; and
a reference signal circuit responsive to the control signal and configured to change the threshold to the selected level.

2. An electronic circuit according to claim 1, wherein the reference signal circuit comprises:
a multiple voltage source configured to provide more than one voltage level; and
a selection circuit responsive to the control signal and configured to provide one of the voltage levels from the multiple voltage source to the compare circuit.

3. An electronic circuit according to claim 2, wherein the selection circuit comprises at least one of a pass gate and a multiplexer.

4. An electronic circuit according to claim 1, wherein the selected level is between a current value of the input signal and a midpoint of the input signal.

5. An electronic circuit according to claim 1, wherein the selected time is selected according to a stabilization time of the input signal.

6. An electronic circuit according to claim 1, wherein the selected level is selected according to a magnitude of an instability in the input signal.

7. A receiver having a dynamic threshold circuit, comprising:
a comparison circuit configured to compare an input signal to a threshold and generate an output signal according to the comparison; and
a threshold supply configured to provide the threshold to the comparison circuit and change the threshold to a selected level at a selected time, wherein the threshold supply comprises:
a control circuit coupled to the comparison circuit and configured to generate a control signal at the selected time in response to a change in the output signal, wherein the control circuit comprises a delay circuit; and
a reference signal circuit responsive to the control signal and configured to change the threshold to the selected level.

8. A receiver according to claim 7, wherein the reference signal circuit comprises:
a multiple voltage source configured to provide more than one voltage level; and
a selection circuit responsive to the control signal and configured to provide one of the voltage levels from the multiple voltage source to the comparison circuit.

9. A receiver according to claim 8, wherein the selection circuit comprises at least one of a pass gate and a multiplexer.

10. A receiver according to claim 7, wherein the selected level is between a current value of the input signal and a midpoint of the input signal.

11. A receiver according to claim 7, wherein the selected time is selected according to a stabilization time of the input signal.

12. A receiver according to claim 7, wherein the selected level is selected according to a magnitude of an instability in the input signal.

13. A memory system comprising:
a memory having an input; and
a dynamic threshold circuit having an input configured to receive an input signal and an output configured to provide an output signal to the input of the memory, wherein the dynamic threshold circuit is configured to compare the input signal to a threshold and generate the output signal according to the comparison, and selectively change the threshold to a level between a current level of the input signal and a midpoint of the input signal;
wherein the dynamic threshold circuit comprises: a comparison circuit configured to compare the input signal to the threshold, and a threshold supply configured to provide the threshold to the comparison circuit;
wherein the threshold supply comprises a control circuit coupled to the comparison circuit and configured to generate a control signal in response to a change in the output signal, and wherein the control circuit comprises a delay circuit.

* * * * *